United States Patent
Smith et al.

(10) Patent No.: US 7,640,151 B2
(45) Date of Patent: Dec. 29, 2009

(54) ASYNCHRONOUS CLOCK DOMAIN CROSSING JITTER RANDOMISER

(75) Inventors: Simon Smith, Bristol (GB); Geoff Barrett, Bristol (GB); Martin Vickers, Bristol (GB)

(73) Assignee: Broadcom Corporation, Irvine, CA (US)

( * ) Notice: Subject to any disclaimer, the term of this patent is extended or adjusted under 35 U.S.C. 154(b) by 580 days.

(21) Appl. No.: 10/812,103

(22) Filed: Mar. 30, 2004

(65) Prior Publication Data

US 2005/0222832 A1    Oct. 6, 2005

(51) Int. Cl.
*G06F 17/50* (2006.01)

(52) U.S. Cl. .............................. 703/14; 703/15; 703/16; 703/17; 703/19

(58) Field of Classification Search ............. 703/14–16, 703/17, 19
See application file for complete search history.

(56) References Cited

U.S. PATENT DOCUMENTS

| | | | | |
|---|---|---|---|---|
| 4,575,644 A | * | 3/1986 | Leslie | 327/198 |
| 4,797,838 A | * | 1/1989 | Nelson et al. | 326/94 |
| 5,390,190 A | * | 2/1995 | Nanda et al. | 714/727 |
| 5,809,283 A | * | 9/1998 | Vaidyanathan et al. | 703/16 |
| 5,826,061 A | * | 10/1998 | Walp | 716/6 |
| 6,598,191 B1 | * | 7/2003 | Sharma et al. | 714/726 |
| 7,006,960 B2 | * | 2/2006 | Schaumont et al. | 703/15 |
| 2003/0125916 A1 | * | 7/2003 | Benis | 703/14 |
| 2004/0225977 A1 | * | 11/2004 | Akkerman | 716/6 |
| 2004/0230414 A1 | * | 11/2004 | Hoppe et al. | 703/14 |
| 2005/0131665 A1 | * | 6/2005 | Ho et al. | 703/14 |

OTHER PUBLICATIONS

B. W. Curran, "IBM eServer z900 high-frequency microprocessor technology, circuits, and design methodology" Jul./Sep. 2002, IBM Jounral of Research and Development, vol. 46, No. 4/5, pp. 631-644.*
Cadence NC-Verilog Tutorial for SimVision Waveform Viewer Users, Cadence Design Systems, Inc., Product Version 3.40, Jan. 2002.*

* cited by examiner

*Primary Examiner*—Eron J Sorrell
(74) *Attorney, Agent, or Firm*—Sterne, Kessler, Goldstein & Fox P.L.L.C.

(57) ABSTRACT

A method and system for simulation of an electronic circuit is provided, the circuit being represented by a network of a plurality of logic elements, the circuit comprising first and second asynchronous clock domains, whereby jitter elements are additionally inserted at predetermined portions of circuit boundaries between the first and second clock domains, the jitter elements being represented as logic elements, the values of which are randomly set.

7 Claims, 2 Drawing Sheets

ASYNCHRONOUS CLOCK DOMAIN CROSSING JITTER RANDOMISER

The present invention relates to electronic integrated circuit design, and more specifically to a method and system for simulation of electronic circuits and particularly for simulating circuits being represented by a network of logical elements.

Due to their increased integration density and functionality, the design of electronic integrated circuits has become ever more complex.

The complexity of the electronic integrated circuits requires particular strategies in the design cycle. Conventional strategies are "top down", "bottom up", or similarly structured approaches.

In a top down approach for instance, the design of a particular integrated circuit starts at a relatively high level of abstraction, and thereafter the relevant design is progressively refined at increasingly lower levels of abstraction—from a functional point of view—by starting at a "systems level", proceeding via an "algorithm register transfer and/or logic level" to a "circuit level" etc., or—from a structural point of view—by starting at a "processor—and/or memory level", proceeding via a sub-system module gate level to a "transistor level", etc.), until finally the mask data required for manufacturing the components is obtained.

Thereby, appropriate tests corresponding with each design stage take place (at every level of abstraction); in case of faults the design result must then be modified, and/or the corresponding design step repeated, or the design started anew at a higher level.

This procedure is able to ensure—despite the increased component complexity due to higher integration density and increased functionality—that the designed integrated circuit operates in a fault-free fashion.

The total layout design data for the above further semiconductor circuits is then made available—as described above—based for instance exclusively on re-used, or on re-used and on re-designed layout blocks.

On a logical level, the logical circuits are designed using simulation systems wherein a circuit design is expressed in a hardware description language (HDL). An example of a hardware description language is Verilog® as described by the Institute of Electrical and Electronics Engineers (IEEE) Standard 1364 and an example of a simulation system is NCVerilog® available from Cadence®, 2655 Seely Avenue, San Jose, Calif. 95134.

Normally, when developing a circuit design, the majority of simulation work is done on a cycle level. Cycle level simulation comprises a sampling process which acquires states of a circuit design.

In cycle level simulations logic functions effectively happen in zero time, so generally all signals appear to change at the same time. Later in the design process, as designs are mapped to gates like electronic logic gates, gate-level simulations are usually developed and these can be used to investigate timing relationships. Such timing-annotated simulations take a lot of memory to run and are slow; they are also only available at a late stage in the development.

Therefore, it is an object of the present invention to provide a method and system for circuit simulation that allows for the finding of faults easier in the design and to identify them earlier in the design cycle.

In one embodiment of the present invention, a method for simulation of an electronic circuit is provided. The circuit being represented by a network of a plurality of logic elements. The circuit comprises a first and second asynchronous clock domain, whereby jitter elements are additionally inserted at predetermined portions of circuit boundaries between the first and second asynchronous clock domains. The jitter elements being represented as logic elements, the values of which are randomly set.

Preferably, the simulation may be carried out on cycle level of a description of the electronic circuit.

Preferably, the jitter elements may further comprise delay elements for introducing predetermined timing delays which are randomly exercised.

Further preferably, the jitter elements may also comprise x generator elements for introducing predetermined signal values which are randomly generated.

Yet further preferably, the jitter elements may be interactively inserted by a user, or be automatically inserted using predetermined modules.

The invention comprises also a method of designing an electronic circuit, comprising a step of simulating the electronic circuit with the inventive method as described above.

A further embodiment of the present invention provides for a simulation system for simulating an electronic circuit. The circuit being representable by a network of logical elements. The circuit comprises a first and second asynchronous clock domain, wherein jitter elements are additionally insertable at predetermined portions of circuit boundaries between the first and second asynchronous clock domains. The jitter elements being representable as logical elements, the values of which are randomly set.

Preferably, the simulation may be carried out on cycle level description of the electronic circuit.

Preferably, the jitter elements may further comprise delay elements for introducing predetermined timing delays which is randomly exercised.

Further preferably, the jitter elements may also comprise x generator elements for introducing predetermined signal values which are randomly generated.

Yet further preferably, the jitter elements may be interactively inserted by a user or automatically inserted using predetermined modules.

In yet another embodiment of the invention, a computer-readable storage medium is provided comprising program code for performing the simulation method according to the invention, when loaded into a computer system.

In yet another embodiment of the invention, a computer-readable storage medium is provided comprising program code for performing the circuit design method according to the invention, when loaded into a computer system.

One advantage of the invention is that faults in the design can be identified at a higher level of the design, resulting in quicker simulation times. Thus, simulations according to the invention will provide indications of failures at cycle level rather than on gate level.

Thus, design iterations down to a transistor level may be avoided.

A further advantage of the present invention is that it requires less memory, when implemented in computer software, than methods used for gate-level simulations.

BRIEF DESCRIPTION OF THE DRAWINGS

The foregoing and other teachings and advantages of the present invention will become more apparent upon a detailed description of the preferred embodiment of the invention as rendered below. In the description to follow reference will be made to the accompanying drawings, in which.

DETAILED DESCRIPTION OF THE PREFERRED EMBODIMENT

Complex logical circuits as considered here comprise several portions where signals are timed according to different clocks. In the following, boundaries between such portions are called clock boundaries. When a signal crosses a clock boundary in the logical circuit it is difficult to capture the signal if the two clocks involved are not in synchronicity.

If a signal is comprised of many data bits, when the corresponding data makes transitions from value 1 to value 2, there will be a finite amount of time where the signal can adopt a value other than value 1 or value 2 at the location of capture (e.g. in a flip-flop). For a 4 bit bus, if the data is changing from 0 to 3 the data could progress as 0-1-3 or as 0-2-3 depending on the relative timing delays seen on a data bus for each respective bit at the point of capture.

Figure 1:
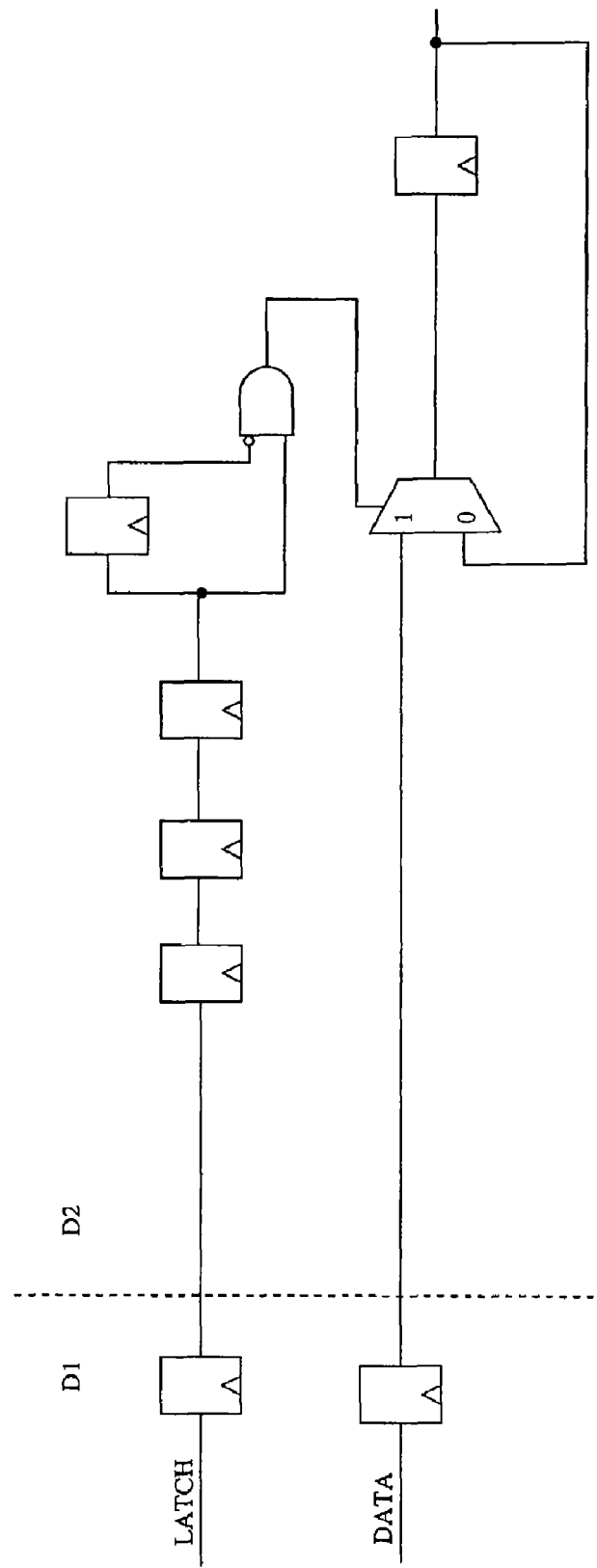
FIG. 1 shows a portion of a logical circuit having two clock domains designated D1 and D2, respectively.

FIG. 1 illustrates a section of a circuit diagram having two portions with two clock domains designated D1 and D2, respectively. In FIG. 1 the different clock domains are separated by dashed lines. FIG. 1 illustrates state of the art counter measures to reduce the probability of metastability in a logical circuit due to asynchronous clock domains.

Figure 2:
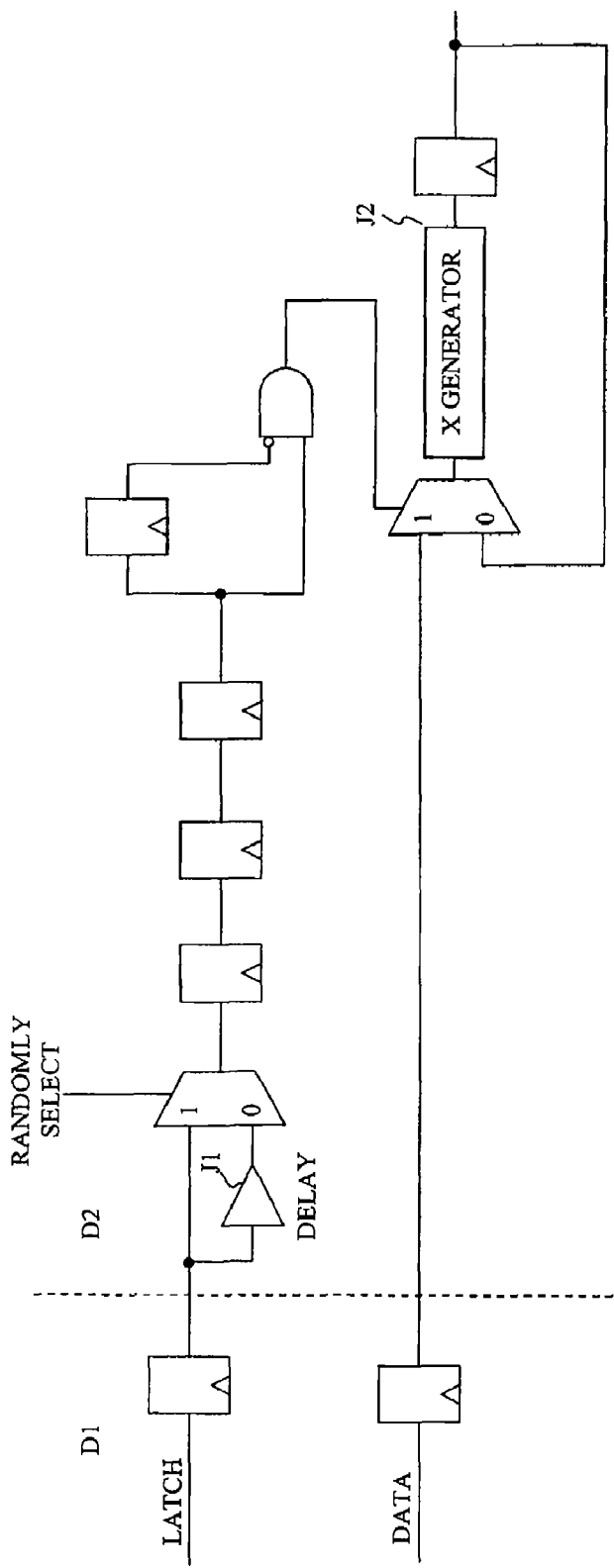
FIG. 2 shows the circuit of FIG. 1 wherein jitter elements are inserted according to the invention.

FIG. 2 shows jitter elements additionally inserted at the entry portions of the respective clock domains D1, D2, as taught by the present invention. Jitter elements according to the invention comprise delay elements and x generator elements. Delay elements J1 are added to introduce a predetermined timing delay which is exercised to the circuit via random selection. X generator elements J2 are added to introduce predetermined signal values in the circuit which are generated by a pseudo-random number generator.

The additionally introduced jitter elements bring real world effects into an ideal simulation, causing faults more likely to happen.

The jitter elements consist of the same building blocks as the building blocks that are used to design the logical circuits themselves.

Jitter elements typically are inserted at any points where data is handed over different clock domains D1, D2.

The insertion points may be determined by the circuit designer or automatically, e.g., by the circuit development system.

In the example described herein, two clock domains D1, D2 are given. It is clear, that the example of two clock domains herein should not be understood as limiting the present invention. A circuit may comprise many clock domains, and thus many clock boundaries.

The invention as described herein can be implemented in digital and/or analogous circuitry, in particular in computer hardware, software, or in combinations thereof. The invention can also be implemented in a computer program embodied in a computer storage device for execution by a programmable processor. Method steps according to the invention can be performed by a programmable processor executing a program of instructions to perform functions of the invention by operating on the basis of input data, and by generating output data. The invention may be implemented in one or several computer programs that are executable in a computer system, which includes at least one programmable processor coupled to receive data from, and transmit data to, a storage system, at least one input device, and at least one output device, respectively.

Computer programs may be implemented in assembly or machine code, and/or in a high-level or object-oriented programming language. The computer program may be a language or code which is to be compiled before being executed by the processor, or be interpreted during execution by the processor. Processors may include general and special purpose microprocessors. A processor receives instructions and data from memories, in particular from read-only memories and/or random access memories. A computer may include one or more storage devices for storing data; such devices may include magnetic disks, such as internal hard disks and removable disks; magneto-optical disks; and optical disks. Storage devices suitable for tangibly embodying computer program instructions and data include all forms of memory, including e.g. semiconductor memory devices, such as flash memories, EPROM, EEPROM; magnetic disks such as hard disks; magneto-optical disks; CD-ROMs, and DVD ROMs. Any of the foregoing can be supplemented by or incorporated in customized application-specific integrated circuits (ASICs).

A computer may include a processor, memory coupled to the processor, a hard drive controller, a video controller and an input/output controller coupled to the processor by a processor bus. The hard drive controller is coupled to a hard disk drive suitable for storing executable computer programs, including programs embodying the present technique. The I/O controller is coupled by means of an I/O bus to an I/O interface. The I/O interface receives and transmits in analogue or digital form over at least one communication link. Such a communication link may be a serial link, a parallel link, local area network, or wireless link (e.g. an RF communication link). A display is coupled to an interface, which is coupled to an I/O bus. A keyboard and pointing device are also coupled to the I/O bus. Alternatively, separate buses may be used for the keyboard pointing device and I/O interface.

The invention can be implemented on a computer system having a display device such as a CRT monitor or LCD screen for displaying information to a user, and a keyboard and a pointing device such as a mouse or a trackball by which the user can provide input to the computer system. The computer system can be programmed to provide a graphical or text user interface through which computer programs interact with users.

Other embodiments are in the scope of the following claims.

The invention claimed is:

1. A simulation system for simulating a response of an electronic circuit, the circuit being representable by a network of logical elements, comprising:
   a first asynchronous clock domain; and
   a second asynchronous clock domain, coupled to the first asynchronous clock domain, including a first jitter element and a second jitter element, wherein the first jitter element includes a delay element and a multiplexer, the first jitter element being configured to randomly introduce predetermined timing delays into data from the first asynchronous clock domain, the first jitter element being insertable in the second asynchronous clock domain at a circuit boundary between the first asynchronous clock domain and the second asynchronous clock domain, and the second jitter element includes an x generator element configured to randomly introduce predetermined signal values into the data from the first asynchronous clock domain.

2. The system of claim 1, wherein at least one of the first jitter element and the second jitter element is interactively inserted by a user.

3. The system of claim 1, wherein at least one of the first jitter element and the second jitter element is configured to be automatically inserted using predetermined modules.

4. The system of claim 1, wherein at least one of the first jitter element and the second jitter element is representable as logical elements, the values of which are randomly set.

5. An electronic circuit representable by a network of logical elements, comprising:
- a first asynchronous clock domain; and
- a second asynchronous clock domain, coupled to the first asynchronous clock domain, including a first jitter element and a second jitter element, wherein the first jitter element includes a delay element and a multiplexer, the first jitter element being configured to randomly introduce predetermined timing delays into data from the first asynchronous clock domain, the first jitter element being insertable in the second asynchronous clock domain at a circuit boundary between the first asynchronous clock domain and the second asynchronous clock domain, and the second jitter element includes an x generator element configured to randomly introduce predetermined signal values into the data from the first asynchronous clock domain.

6. The circuit of claim 5, wherein at least one of first jitter element and the second jitter element is interactively inserted by a user.

7. The circuit of claim 5, wherein at least one of first jitter element and the second lifter element is configured to be automatically insertable using predetermined modules.

* * * * *

UNITED STATES PATENT AND TRADEMARK OFFICE
CERTIFICATE OF CORRECTION

PATENT NO. : 7,640,151 B2
APPLICATION NO. : 10/812103
DATED : December 29, 2009
INVENTOR(S) : Smith et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1100 days.

Signed and Sealed this

Ninth Day of November, 2010

David J. Kappos
*Director of the United States Patent and Trademark Office*